United States Patent [19]

Hornig et al.

[11] 4,030,966
[45] June 21, 1977

[54] METHOD OF HYDROTHERMALLY GROWING QUARTZ

[75] Inventors: Carl F. Hornig, Kingston; Kenneth M. Kroupa, Lee, both of N.H.; Earle E. Simpson, Georgetown, Mass.

[73] Assignee: Western Electric Company, Inc., New York, N.Y.

[22] Filed: June 27, 1975

[21] Appl. No.: 590,888

[52] U.S. Cl. .......................... 156/623 Q; 23/301 R; 23/273 R; 24/81 R; 423/339
[51] Int. Cl.² ................... B01J 17/04; C01B 33/12
[58] Field of Search ..................... 24/81 FC, 81 R; 156/623 Q, 623 R; 23/295, 273 R, 301 R; 423/339

[56] References Cited

UNITED STATES PATENTS

| | | | |
|---|---|---|---|
| 1,394,697 | 10/1921 | Tornsjo | 24/81 FC |
| 1,415,189 | 5/1922 | Oxley | 24/81 FC |
| 2,066,732 | 1/1937 | Kunz | 24/81 FC |
| 2,537,703 | 1/1951 | Randa | 24/81 R |
| 2,674,520 | 4/1954 | Sobek | 23/273 M |
| 2,690,107 | 9/1954 | Ludwig | 24/81 FC |
| 2,923,606 | 2/1960 | Hale | 156/623 Q |
| 2,994,593 | 8/1961 | Sullivan | 23/273 H |
| 3,623,847 | 11/1971 | Gehres | 156/623 Q |

*Primary Examiner*—Stephen J. Emery
*Attorney, Agent, or Firm*—D. D. Bosben; D. J. Kirk

[57] ABSTRACT

This invention relates to a method of growing a single quartz crystal stone. In particular, a method for hydrothermally growing a quartz stone from a quartz seed is disclosed. A substantially stress-free quartz stone is grown in an autoclave by clamping a quartz crystal seed plate in a clip so as to permit substantially unobstructed growth of the stone in the plane of the seed plate, and growing at least a portion of the stone through at least one aperture formed in the clip.

2 Claims, 5 Drawing Figures

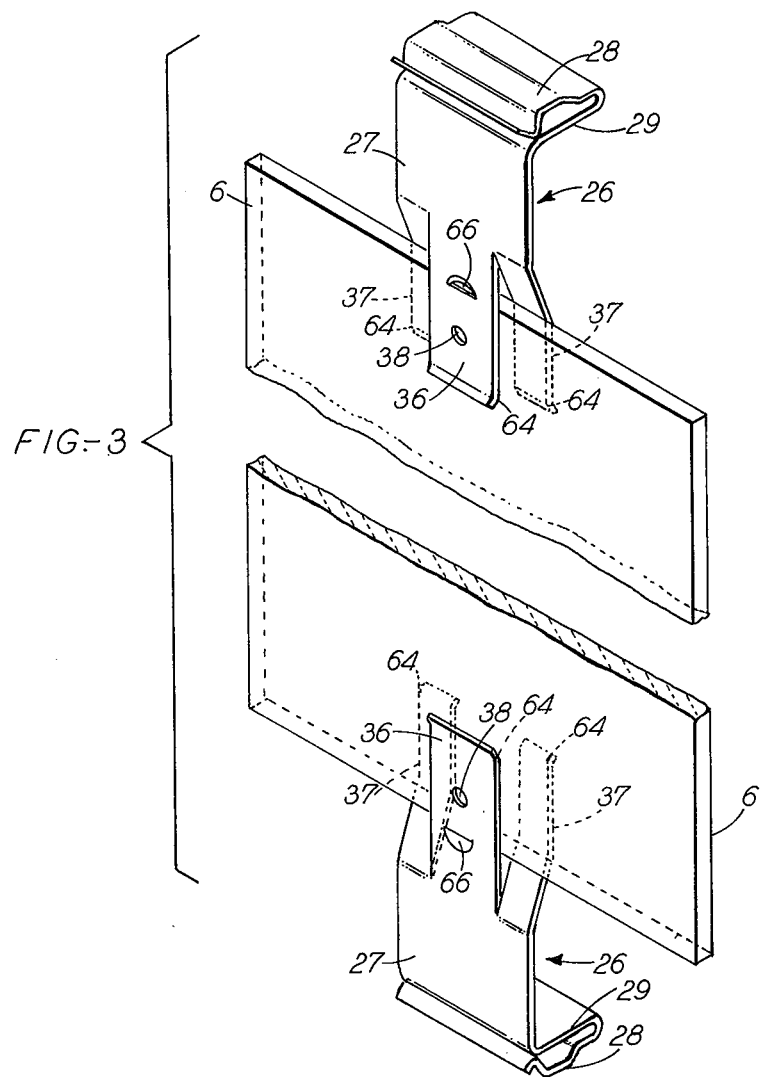
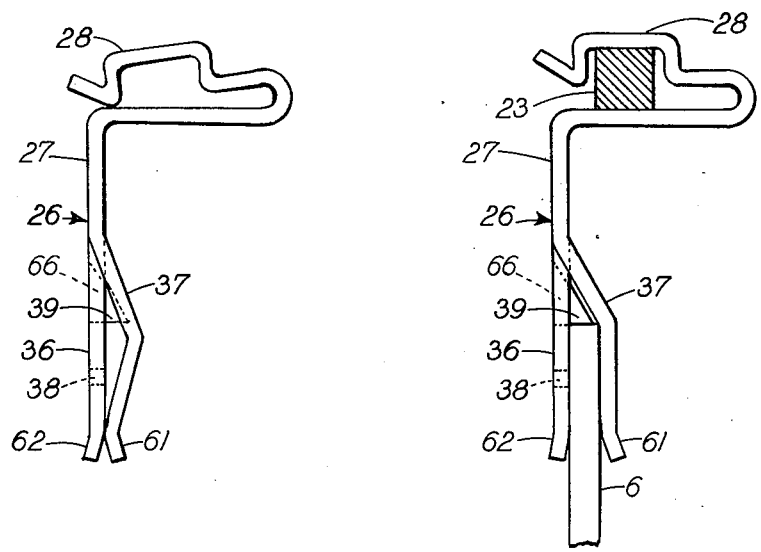

METHOD OF HYDROTHERMALLY GROWING QUARTZ

BACKGROUND OF THE INVENTION

1. Field of the Invention

This invention relates to hydrothermal growth of single quartz crystals. In particular, the invention is directed to a method of growing substantially stress-free quartz crystal stones on quartz crystal seeds.

2. Description of the Prior Art

Hydrothermal synthesis of quartz has been known for many years and has presently been refined to a point where a substantial amount of quartz used for frequency control applications today is synthetic or cultured quartz. In the commonly practiced commercial process for the hydrothermal synthesis of quartz, a vertical autoclave holds a supply of quartz nutrient in a bottom portion thereof, and is filled over half full with an aqueous solvent. The upper portion of the autoclave includes a plurality of planar quartz seed plates supported by a seed rack. The autoclave is sealed and then heated to increase the temperature and pressure sufficiently to cause the nutrient to dissolve into solution and thereafter be deposited on the seed plates. The autoclave is maintained in this condition for a number of days until stones of a desired size are grown on each of the seed plates in the seed rack.

The prior art discloses many ways for holding planar quartz seed plates in seed racks. In one known arrangement shown in U.S. Pat. No. 2,994,593 to Sullivan which is assigned to Western Electric Company, Inc. of New York, New York, clips of bendable metal are bent to contact the ends and the major faces of the seed plate and the distal portions of the clips are bent over horizontal supports of the seed rack. Another arrangement for holding seeds in the rack is to cut inwardly converging diagonal slots in the ends of the seed plate, insert wires therethrough and tie the wire to horizontal supports of the rack.

In the bendable clip arrangement, the growing quartz must grow around the bent portions that contact the surface of the seed plate. It has been found that in growing around such portions stresses are formed in the quartz stone resulting in dislocations and cracks which reduce the amount of usable quartz that can be cut from such a stone. When using the above-referred to slotting procedure, the forming of the slot itself will add stresses in the quartz plate which result in low yields. Also, such a procedure is tedious, requiring a substantial time to slot the seed plate in addition to the time required to wire the plates to the seed racks.

SUMMARY OF THE INVENTION

The foregoing problems have been solved by the instant method of hydrothermally growing a single quartz crystal from a quartz crystal seed. The method comprises the steps of: clamping a quartz crystal seed in a clamping means during the growth of the single quartz crystal so as to permit substantially unobstructed growth of the quartz crystal in the plane of the seed plate; and growing a portion of the quartz crystal through an aperture or opening formed in the clamping means.

Thus, stresses caused by mounting, which can result in cracking and dislocations in the grown single crystal quartz stone, are substantially eliminated by the instant method. This result is attained by permitting a portion of the quartz to grow through at least a portion of the clamping means to relieve stresses that would otherwise be induced therein. Advantageously, such a method results in high quality-high yield cultured quartz.

Additionally, the instant invention substantially simplifies and reduces the time required to mount seeds in the seed rack.

A further advantage is that the quartz seed is held securely in place during the growth process to preclude undesirable twisting and touching of adjacent quartz seeds.

BRIEF DESCRIPTION OF THE DRAWINGS

FIG. 3 is an isometric view of a quartz seed plate with a pair of the quartz seed clips attached thereto;

FIG. 4 is a side view of the quartz seed clip; and

FIG. 5 is a side view of the quartz seed clip affixed to a seed plate.

DETAILED DESCRIPTION OF THE INVENTION

Figure 1:
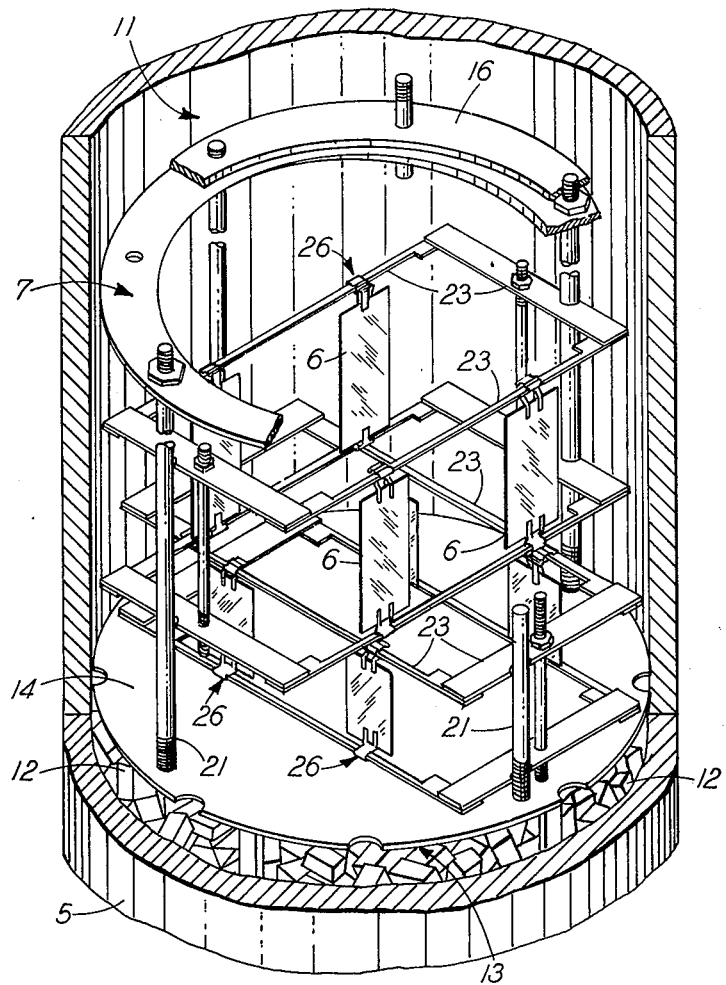
FIG. 1 is a partial isometric view of a quartz crystal growing autoclave and a seed assembly mounted therein.

FIG. 1 shows a quartz crystal growing autoclave 5 which may be of the type disclosed in U.S. Pat. No. 2,785,058 to E. Buehler which is assigned to the Bell Telephone Laboratories, Inc. of New York, New York. A plurality of quartz seed plates 6—6 are supported by a seed rack, generally designated by the numeral 7, in an aqueous nutrient solution (not shown) within a quartz growing region 11 of the autoclave 5. Nutrient 12, consisting of small particles of natural or synthetic quartz, is contained in a lower nutrient dissolving region, generally designated by the numeral 13, of the autoclave 5 immediately below the growing region 11.

The seed rack 7 is supported in the growing region 11 by a plate 14. The plate 14 is essentially circular so as to fit within the autoclave 5 with very little clearance between its circumference and the inner surface of the autoclave 5. The plate 14 also serves as a baffle which separates hot nutrient solution (not shown) in the dissolving region 13 and cooler supersaturated solution (not shown) in the growing region 11. This separation is required in order to maintain a desired temperature differential between the two regions 11 and 13 which produces the supersaturated solution in the region 11 to facilitate the depositing out of quartz from the solution onto the seed plates 6—6.

A plurality of opposing, parallel guide rods 21—21 have lower ends mounted in and extend upward from the plate 14 and have a top member, ring 16, attached to their upper ends. Horizontal support bars 23—23 are mounted in several spaced planes each of which is transverse to the parallel guide rods 21—21. A plurality of planar quartz seed plates 6—6 are individually secured to the horizontal support bars 23—23 by a pair of quartz seed clips 26—26 (also see FIG. 3) which are located at the top and the bottom of each seed plate 6.

Figure 2:
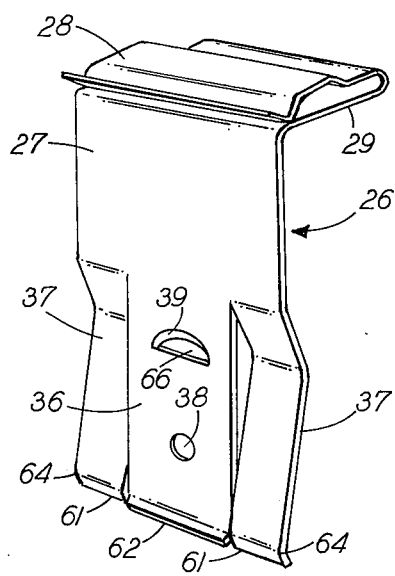
FIG. 2 is an isometric view of a quartz seed clip for implementing the method of the invention.

FIG. 2 depicts the quartz seed clip 26 in detail. The clip 26 has an upper body portion 27 which is folded to form an upper section 28 and a lower section 29, which are aligned and oppose one another in order to slidably receive, and clamp onto, the horizontal support bar 23 (see FIGS. 1 and 5). A center finger 36 and a pair of outer fingers 37—37 depend from junctions with the upper body portion 27. The center finger 36 has an aperture 38 and a dimple stop 39 formed therein, the aperture being essentially positioned intermediate the dimple and a lower (as viewed in FIG. 2) seed plate engaging end of the clip 26.

FIG. 3 shows a seed plate 6 which has been urged between the center finger 36 and the outer fingers 37—37 of a pair of clips 26—26. The clips 26—26 are made of spring steel or the like to enable the fingers 36 and 37 to firmly clamp the seed plate 6 inserted therebetween. Although the seed plate 6 could be mounted using a single clip 26, the use of clips at the top and bottom of the plate further insures the stability thereof and prevents undesirable contact between adjacent seed plates during the growing process. After the clips 26—26 have been affixed to the seed plate 6, the folded sections 28 and 29 of the body portion 27 of each clip are urged onto the horizontal support bars 23—23, as can best be seen in FIGS. 1 and 5.

Once all the seed plates 6—6 having clips 26—26 thereon are affixed to the horizontal support bars 23—23 of seed rack 7, the rack is inserted into the autoclave 5 for the quartz growing process. Accordingly, the clip 26 provides support for, and limits the twisting or rotational movement of, the seed plate 6 during the growing process. In addition, the clip 26 advantageously facilitates mounting of the seed plates 6—6 and has reduced the mounting time of a seed rack 7 containing approximately 120 seed plates from 10 hours and 40 minutes to approximately 40 minutes.

Most important, applicants have discovered that by growing a portion of the quartz into and/or through the aperture 38 in the seed clip 26, stresses, which heretofore were found in the quartz stone grown without benefit of such an aperture, have been substantially eliminated. Although stresses will also be relieved to some degree, if the aperture 38 is located in any or all of the depending fingers 36 or 37, the aperture in the center finger 36 has provided excellent results. The exemplary embodiment incorporates an aperture 38 in the center leg 36 which is circular in shape, however, the instant concept is not so limited. The aperture 38 may take on a number of geometric configurations (i.e., square, triangular, trapezoidal, etc.) and fall within the purview of the instant invention. For it is not the geometric configuration of the aperture 38 that is crucial, but it is the fact that such an aperture permits quartz growth therethrough. Such growth results in a quartz stone which has substantially no stresses induced therein due to the seed clips 26—26 used to mount the quartz seed plates 6—6 in the autoclave 5. Additionally, the size of the aperture 38 and the number of such apertures can vary widely but excellent results have been obtained with a single aperture having a diameter of 0.0625 inch (0.1588 cm).

FIG. 4 shows a side view of the seed clip 26 prior to insertion of the seed plate 6 therein and connection to the support bar 23. It can be seen that the outer fingers 37—37 (one shown) are bowed outwardly, away from the center finger 36. The distal portions 61—61 (one shown) of the outer fingers 37—37 and portion 62 of the center finger 36 are bent away from each other at an angle of about 30°. Such an angular relationship serves to facilitate the insertion of the quartz seed plate 6 into the clip 26.

FIG. 5 shows a side view of the seed clip 26 attached to the horizontal support bar 23 with the seed plate 6 inserted therein. It should be noted that once the quartz plate 6 has been inserted into the clip 26, the outer fingers 37—37 are substantially parallel with the plane of the center finger 36 and the center and outer fingers making full contact with the major faces of the seed plate 6. Advantageously, such contact provides acceptable clamping forces while distributing such forces over a relatively large surface area. Such a distribution of forces substantially reduces stresses that would otherwise be induced in the seed plate 6 if a smaller contact area such as a point or line contact were used.

It should also be noted that corners 64—64 (see FIGS. 2 and 3) on the center finger 36 and the outer fingers 37—37 are rounded. Such rounding of the corners 64—64 precludes any stresses that might otherwise be induced during the quartz growing process due to sharp corners of the clip 26.

The dimple 39, which can best be seen in FIGS. 2 and 3, is spaced from the junctions of the center finger 36 and the outer fingers 37—37 with the body portion 27 and serves a dual function. The dimple 39 limits the insertion of the seed plate into the clip 26 to a predetermined distance so that the edge of the seed plate is slightly spaced from adjacent surface portions of the clamping fingers 37—37, as is clearly shown in FIG. 5, to permit substantially unobstructed stress-free growth of the seed plate longitudinally when the seed plate is of a type (e.g., R bar) which grows in a longitudinal direction. Additionally, an opening or aperture 66, formed when the dimple 39 was made, lies in a plane perpendicular to the plane of the major faces of the seed plate 6 and permits stress-free growth of the quartz therethrough. Advantageously by permitting substantially unrestricted, stress-free quartz growth along the long axis of the seed plate 6, a seed plate of substantially the same size as the oginal seed plate can be cut from the grown single quartz crystal stone.

Although the seed clip 26 can be advantageously used to hold substantially all cuts of quartz plates 6—6, it has been found to be particularly advantageous in the growing of what is referred to as R (rhombohedral) bar quartz, as noted above. R-bar seed will not only grow in thickness in a direction perpendicular to the plane of the seed plate 6, but will grow lengthwise and widthwise from respective edges thereof and in respective directions in the plane of the seed plate. The quartz seed clip 26 allows unrestricted growth of a seed plate 6 in all these directions. Accordingly, by permitting quartz to grow through the aperture 38 in the clip 26, stresses which normally would result as the quartz grows around the clip without such an aperture, are relieved. Furthermore, the opening 66 of the dimple 39 further relieves stresses by permitting growth of the quartz through that opening. Growth in the width direction of the seed plate 6 is unrestricted as the clip 26 does not contact the lateral edges of seed plate 6.

In a specific example of the seed clip 26 used to grow a single quartz crystal stone, the clip was fabricated from spring steel about 0.010 inch thick (0.0254 cm). The clips 26—26 were silver plated to preclude iron from the clip from dissolving and causing low Q of the grown single quartz crystal stone. In addition, the combined width of the outer fingers 37—37 was equal to the width of the center finger 36 to provide maximum stability of the clamped quartz plate 6. The center finger 36 was 0.250 inch (0.635 cm) in width. Each outer finger 37 was 0.125 inch (0.318 cm) in width and the overall length of the seed clip 26 was 0.8125 inch (2.064 cm). The opening 66 had a semicircular configuration with a diameter of 0.125 inch (0.318 cm). The seed plate 6 was approximately 6.5 inches (16.49 cm) long, 2.125 inches (5.40 cm) wide and 0.045 inch (0.114 cm) thick.

Although the instant invention has been described as it relates to a seed clip 26 having a center finger 36 and a pair of outer fingers 37—37 between which a planar seed plate 6 is slidably clamped, the invention is not so limited. A seed having a variety of cross sections (i.e., polygonal or of nonuniform geometry) may be clamped, with the clamp having one or more apertures 38 therein to relieve stresses in the grown stone by growing the quartz crystal through the apertures.

Additionally, although in the exemplary seed clip 26 the two outer fingers 37—37 and the single center finger 36 are used for maximum stability of the planar seed plate 6, the instant concept is not so limited. Where such maximum stability is not required, seed clips having opposed and aligned fingers may be used with one or both of the fingers having a stress-relieving aperture therein. Accordingly, it should be clear that any number of fingers may be used as long as an aperture for relieving stress by growing quartz therethrough is located in one or more of such fingers.

What is claimed is:

1. In a method of hydrothermally growing a substantially stress-free quartz crystal from a planar quartz crystal seed plate having first and second major faces on opposite sides thereof, in which at least a portion of the seed plate adjacent one edge is inserted into and clamped in a supporting clip, and in which the seed plate is of a type which grows in thickness perpendicular to the plane of the seed plate, and in length and width from respective edges thereof in respective directions in the plane of the seed plate, the improvement which comprises the steps of:

clamping the major faces of the seed plate between first and second clamping fingers projecting from a body portion of the supporting clip, with each clamping finger engaging a respective one of the faces, at least one of the clamping fingers having a stress-relieving aperture formed therethrough of a small cross-sectional area in comparison to the cross-sectional area of the clamping finger and at least one of the clamping fingers including a projecting stop spaced from junctions of the first and second clamping fingers with the body portion, the stress-relieving aperture being essentially positioned intermediate the stop and a seed plate engaging end of the supporting clip;

limiting the extent to which the portion of the seed plate is inserted into the supporting clip between the first and second clamping fingers by engaging the one edge of the seed plate with the projecting stop so that the edge is spaced from the junctions of the first and second clamping fingers with the body portion of the supporting clip to permit substantially unobstructed stress-free growth of the quartz crystal from the edge in its respective direction in the plane of the seed plate; and hydrothermally growing a portion of the major face of the quartz crystal seed plate which is engaged by the clamping finger having the stress-relieving aperture, through the stress-relieving aperture in the clamping finger in a direction perpendicular to the plane of the seed plate to reduce stress-cracking of the quartz crystal during the hydrothermal growing thereof.

2. A method as recited in claim 1, wherein the clamping finger which includes the projecting stop also has a stress-relieving aperture of a small cross-sectional area in comparison to the cross-sectional area of the clamping finger extending therethrough adjacent the stop, and which comprises the additional step of:

hydrothermally growing a portion of the one edge of the quartz crystal seed plate through the stress-relieving aperture adjacent the stop to reduce stress-cracking of the quartz crystal during the hydrothermal growing thereof.

* * * * *

UNITED STATES PATENT OFFICE
CERTIFICATE OF CORRECTION

PATENT NO. : 4,030,966
DATED : June 21, 1977
INVENTOR(S) : Carl F. Hornig, Kenneth M. Kroupa and Earle E. Simpson It is certified that error appears in the above-identified patent and that said Letters Patent are hereby corrected as shown below:

Column 3, line 3, "stop" should read --(stop)--. Column 4, line 21, "limits" should read --acts as a stop and is engaged by the adjacent edge of the seed plate 6 to limit--; line 36, "oginal" should read --original--.

Signed and Sealed this

First Day of November 1977

[SEAL]

Attest:

RUTH C. MASON
Attesting Officer

LUTRELLE F. PARKER
Acting Commissioner of Patents and Trademarks